United States Patent
Watanabe (10) Patent No.: US 8,847,236 B2
(45) Date of Patent: Sep. 30, 2014

(54) SEMICONDUCTOR SUBSTRATE AND SEMICONDUCTOR SUBSTRATE MANUFACTURING METHOD

(71) Applicant: Seiko Epson Corporation, Tokyo (JP)

(72) Inventor: Yukimune Watanabe, Hokuto (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 13/735,444

(22) Filed: Jan. 7, 2013

(65) Prior Publication Data

US 2013/0181230 A1 Jul. 18, 2013

(30) Foreign Application Priority Data

Jan. 18, 2012 (JP) ................. 2012-008102

(51) Int. Cl.
 *H01L 29/15* (2006.01)
 *H01L 21/02* (2006.01)
 *H01L 29/16* (2006.01)
 *H01L 29/165* (2006.01)

(52) U.S. Cl.
 CPC .... *H01L 21/02378* (2013.01); *H01L 21/02639* (2013.01); *H01L 21/02447* (2013.01); *H01L 29/1608* (2013.01); *H01L 21/02529* (2013.01); *H01L 21/02381* (2013.01); *H01L 21/0262* (2013.01); *H01L 21/02002* (2013.01); *H01L 21/0265* (2013.01); *H01L 21/02656* (2013.01); *H01L 21/02647* (2013.01); *H01L 29/165* (2013.01)
 USPC ....... 257/77; 257/190; 257/E29.104; 438/481

(58) Field of Classification Search
 CPC ............... H01L 21/02529; H01L 21/02639; H01L 21/02447; H01L 21/02647; H01L 21/0265; H01L 29/1608
 USPC ............... 257/77, 613, E29.104, 190, 178; 438/481
 See application file for complete search history.

(56) References Cited

U.S. PATENT DOCUMENTS

2001/0053618 A1* 12/2001 Kozaki et al. ............... 438/933
2011/0207322 A1* 8/2011 Yamaguchi ................. 438/667

FOREIGN PATENT DOCUMENTS

JP 11181567 A * 7/1999
JP A 11-181567 7/1999

* cited by examiner

*Primary Examiner* — Fernando L Toledo
*Assistant Examiner* — Aaron Gray
(74) *Attorney, Agent, or Firm* — Oliff PLC (57) ABSTRACT

A semiconductor substrate includes: a silicon substrate; a monocrystalline silicon carbide film formed on a surface of the silicon substrate; and a stress relieving film formed on the surface of the silicon substrate opposite from the side on which the monocrystalline silicon carbide film is formed, and that relieves stress in the silicon substrate by applying compressional stress to the silicon substrate surface on which the stress relieving film is formed, wherein a plurality of spaces is present in the monocrystalline silicon carbide film in portions on the side of the silicon substrate and along the interface between the monocrystalline silicon carbide film and the silicon substrate.

13 Claims, 8 Drawing Sheets

SEMICONDUCTOR SUBSTRATE AND SEMICONDUCTOR SUBSTRATE MANUFACTURING METHOD

BACKGROUND

1. Technical Field

The present invention relates to semiconductor substrates, and to semiconductor substrate manufacturing methods.

2. Related Art

Silicon carbide (SiC), a wide bandgap semiconductor, has a bandgap at least twice as large as that of the common silicon (Si), and has attracted interest as material for high-voltage devices. Because SiC has a higher crystal forming temperature than Si, it is difficult to form a single crystal ingot by using the pulling method from the liquid phase, and the sublimation method is used to form a single crystal ingot. However, it is very difficult with the sublimation method to form a large-diameter SiC substrate having a few crystal defects. For this reason, the SiC substrates currently available in the market have a diameter of 3 to 4 inches, and are very expensive.

There are different types of SiCs, such cubical SiC (3C-SiC) and hexagonal SiCs (4H-SiC, 6H-SiC), depending on the crystalline structure. Of these, the SiC (3C-SiC) having a cubical crystal structure can be formed at relatively low temperatures, and enables direct epitaxial growth on a Si substrate. In this connection, the heteroepitaxial technique that grows 3C-SiC crystal on a Si substrate surface has been studied as a means to increase the SiC substrate diameter. However, the lattice constants of Si and 3C-SiC are 0.543 nm and 0.436 nm, respectively, and the difference is about 20%. Further, Si and 3C-SiC have coefficients of thermal expansion of $2.55 \times 10^{-6}$ $K^{-1}$ and $2.77 \times 10^{-6}$ $K^{-1}$, respectively, which account for an about 8% difference. Because of these differences in lattice constant and coefficient of thermal expansion, it is difficult with Si and 3C-SiC to obtain a high-quality epitaxial film having a few crystal defects. Further, the differences in lattice constant and coefficient of thermal expansion are also problematic, because such differences generate a large stress in the Si substrate, and cause wafer bending.

There have been studies of techniques for solving such problems. For example, JP-A-11-181567 proposes forming a masking layer on a surface of a silicon carbide growth substrate, and exposing the substrate surface through openings formed in the masking layer to cause epitaxial growth of the monocrystalline silicon carbide, the opening height being at least $2^{1/2}$ of the opening width and exceeding the thickness of the monocrystalline silicon carbide formed.

However, when a monocrystalline silicon carbide film of an increased thickness is formed on the whole surface of a substrate, the stress in the substrate due to the differences in lattice constant and coefficient of thermal expansion becomes prominent, and wafer bending occurs.

SUMMARY

An advantage of some aspects of the invention is to provide a semiconductor substrate and a semiconductor substrate manufacturing method with which a high-quality monocrystalline silicon carbide film having a few crystal defects can be formed, and wafer bending can be suppressed.

An aspect of the invention is directed to a semiconductor substrate including: a silicon substrate; a monocrystalline silicon carbide film formed on a surface of the silicon substrate; and a stress relieving film formed on the surface of the silicon substrate opposite from the side on which the monocrystalline silicon carbide film is formed, and that relieves stress in the silicon substrate by applying compressional stress to the silicon substrate surface on which the stress relieving film is formed, wherein a plurality of spaces is present in the monocrystalline silicon carbide film in portions on the side of the silicon substrate and along the interface between the monocrystalline silicon carbide film and the silicon substrate.

According to the semiconductor substrate of the aspect of the invention, the plurality of spaces can absorb the stress generated in the monocrystalline silicon carbide film because of the differences in the lattice constants and the coefficients of thermal expansion of the silicon substrate and the monocrystalline silicon carbide. The plurality of spaces also can absorb the stress generated in the silicon substrate because of the differences in the lattice constants and the coefficients of thermal expansion of the silicon substrate and the monocrystalline silicon carbide. Further, the stress relieving film can relieve the stress that cannot be absorbed by the plurality of spaces and remains in the silicon substrate. Specifically, even in the presence of compressional stress acting on the silicon substrate on the surface on which the monocrystalline silicon carbide film is formed because of the differences in the lattice constants and the coefficients of thermal expansion of the silicon substrate and the monocrystalline silicon carbide, the compressional stress acting on the silicon substrate can be cancelled by the compressional stress applied on the opposite surface (the silicon substrate surface with the stress relieving film). As a result, a high-quality monocrystalline silicon carbide film having a few crystal defects can be formed, and wafer bending can be suppressed.

In the semiconductor substrate according to the aspect of the invention, the stress relieving film may have a laminate structure of a first stress relieving film and a second stress relieving film.

With this configuration, different films, specifically, the first stress relieving film and the second stress relieving film can be formed. For example, film forming conditions such as film thickness and film material can be appropriately varied for the first stress relieving film and the second stress relieving film. This makes it possible to adjust the extent to which the stress that cannot be absorbed by the plurality of spaces and remains in the silicon substrate is relieved. Wafer bending can thus be more easily suppressed.

In the semiconductor substrate according to the aspect of the invention, the material forming the stress relieving film may contain any one of silicon oxide, silicon nitride, polysilicon, and amorphous silicon.

With this configuration, a stress relieving film can be realized that can apply compressional stress on the surface of the silicon substrate opposite from the side on which the monocrystalline silicon carbide film is formed.

Another aspect of the invention is directed to a semiconductor substrate manufacturing method including: a first step of forming a masking material on a surface of a silicon substrate; a second step of forming a plurality of openings in the masking material to partially expose the silicon substrate; a third step of epitaxially growing monocrystalline silicon carbide from the exposed surface of the silicon substrate, and stopping the epitaxial growth of the monocrystalline silicon carbide while the surface of the masking material is partially exposed; a fourth step of at least partially removing the masking material; a fifth step of resuming the epitaxial growth of the monocrystalline silicon carbide after the fourth step to form a monocrystalline silicon carbide film; and a sixth step of forming before the fifth step a stress relieving film on the surface of the silicon substrate opposite from the side on which the monocrystalline silicon carbide film is formed, the stress relieving film being formed to apply compressional stress to the silicon substrate surface on which the stress relieving film is formed and to relieve stress in the silicon substrate.

According to the semiconductor substrate manufacturing method of the aspect of the invention, the surface defects generated at the interface between the monocrystalline silicon and the monocrystalline silicon carbide film propagate to the upper layer as the monocrystalline silicon carbide grows, and disappear upon reaching the side walls of the openings of the masking material. Further, the plurality of spaces can absorb the stress generated in the monocrystalline silicon carbide film because of the differences in the lattice constants and the coefficients of thermal expansion of the silicon substrate and the monocrystalline silicon carbide. The plurality of spaces also can absorb the stress generated in the silicon substrate because of the differences in the lattice constants and the coefficients of thermal expansion of the silicon substrate and the monocrystalline silicon carbide. Further, the stress relieving film can relieve the stress that cannot be absorbed by the plurality of spaces and remains in the silicon substrate. Specifically, even in the presence of compressional stress acting on the silicon substrate on the surface on which the monocrystalline silicon carbide film is formed because of the differences in the lattice constants and the coefficients of thermal expansion of the silicon substrate and the monocrystalline silicon carbide, the compressional stress acting on the silicon substrate can be cancelled by the compressional stress applied on the opposite surface (the silicon substrate surface with the stress relieving film). As a result, a high-quality monocrystalline silicon carbide film having a few crystal defects can be formed, and wafer bending can be suppressed.

In the semiconductor substrate manufacturing method according to the aspect of the invention, the sixth step may include: forming a first stress relieving film on the surface of the silicon substrate opposite from the side on which the monocrystalline silicon carbide film is formed; and forming a second stress relieving film on a surface of the first stress relieving film.

With this method, different stress relieving films, specifically, the first stress relieving film and the second stress relieving film can be formed. For example, film forming conditions such as film thickness and film material can be appropriately varied for the first stress relieving film and the second stress relieving film. This makes it possible to adjust the extent to which the stress that cannot be absorbed by the plurality of spaces and remains in the silicon substrate is relieved. Wafer bending can thus be more easily suppressed.

In the semiconductor substrate manufacturing method according to the aspect of the invention, the first stress relieving film may be formed before the third step on the surface of the silicon substrate opposite from the side on which the monocrystalline silicon carbide film is formed, and the second stress relieving film may be formed after the third step and before the fifth step on the surface of the first stress relieving film.

With this method, the stress generated in the silicon substrate because of the differences in the lattice constants and the coefficients of thermal expansion of the silicon substrate and the monocrystalline silicon carbide can be absorbed by the first stress relieving film in the early stage of the epitaxial growth of the monocrystalline silicon carbide in the process of stopping the epitaxial growth of the monocrystalline silicon carbide while the surface of the masking material is partially exposed. Further, the stress generated in the silicon substrate because of the differences in the lattice constants and the coefficients of thermal expansion of the silicon substrate and the monocrystalline silicon carbide can be absorbed by the first stress relieving film and the second stress relieving film in the process of resuming the epitaxial growth of the monocrystalline silicon carbide and forming the monocrystalline silicon carbide film after the masking material is at least partially removed. Specifically, the stress generated in the silicon substrate at different timings can be absorbed by the different stress relieving films. Wafer bending can thus be more easily suppressed.

In the semiconductor substrate manufacturing method according to the aspect of the invention, the stress relieving film may be formed before the third step on the surface of the silicon substrate opposite from the side on which the monocrystalline silicon carbide film is formed, and the thickness of the stress relieving film may be adjusted after the third step and before the fifth step.

With this method, the stress generated in the silicon substrate because of the differences in the lattice constants and the coefficients of thermal expansion of the silicon substrate and the monocrystalline silicon carbide can be absorbed by the stress relieving film in the early stage of the epitaxial growth of the monocrystalline silicon carbide in the process of stopping the epitaxial growth of the monocrystalline silicon carbide while the surface of the masking material is partially exposed. Further, the stress generated in the silicon substrate because of the differences in the lattice constants and the coefficients of thermal expansion of the silicon substrate and the monocrystalline silicon carbide can be absorbed by the stress relieving film of an adjusted thickness in the process of resuming the epitaxial growth of the monocrystalline silicon carbide and forming the monocrystalline silicon carbide film after the masking material is at least partially removed. Specifically, the stress generated in the silicon substrate at different timings can be absorbed by the stress relieving film of varying thicknesses. Wafer bending can thus be more easily suppressed.

In the semiconductor substrate manufacturing method according to the aspect of the invention, the stress relieving film may be formed in the first step on the surface of the silicon substrate opposite from the side on which the monocrystalline silicon carbide film is formed.

With this method, the stress relieving film can be formed in the step of forming the masking material. The manufacturing steps can thus be simplified compared to forming the stress relieving film in a different step from the step of forming the masking material.

In the semiconductor substrate manufacturing method according to the aspect of the invention, the material forming the masking material may contain silicon oxide or silicon nitride.

With this method, the masking material can be formed on the silicon substrate surface by a simple method.

In the semiconductor substrate manufacturing method according to the aspect of the invention, the material forming the stress relieving film may contain any one of silicon oxide, silicon nitride, polysilicon, and amorphous silicon.

With this method, a stress relieving film can be realized that can apply compressional stress on the surface of the silicon substrate opposite from the side on which the monocrystalline silicon carbide film is formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention are described below with reference to the accompanying drawings. The embodiments merely represent aspects of the invention, and do not limit the invention in any ways. Any modifications of the embodiments are thus possible within the technical ideas of the invention. In the drawings, details of the structures, including scales and numbers, are not true to the actual structures for clarity of each configuration.

First Embodiment

Figure 1:
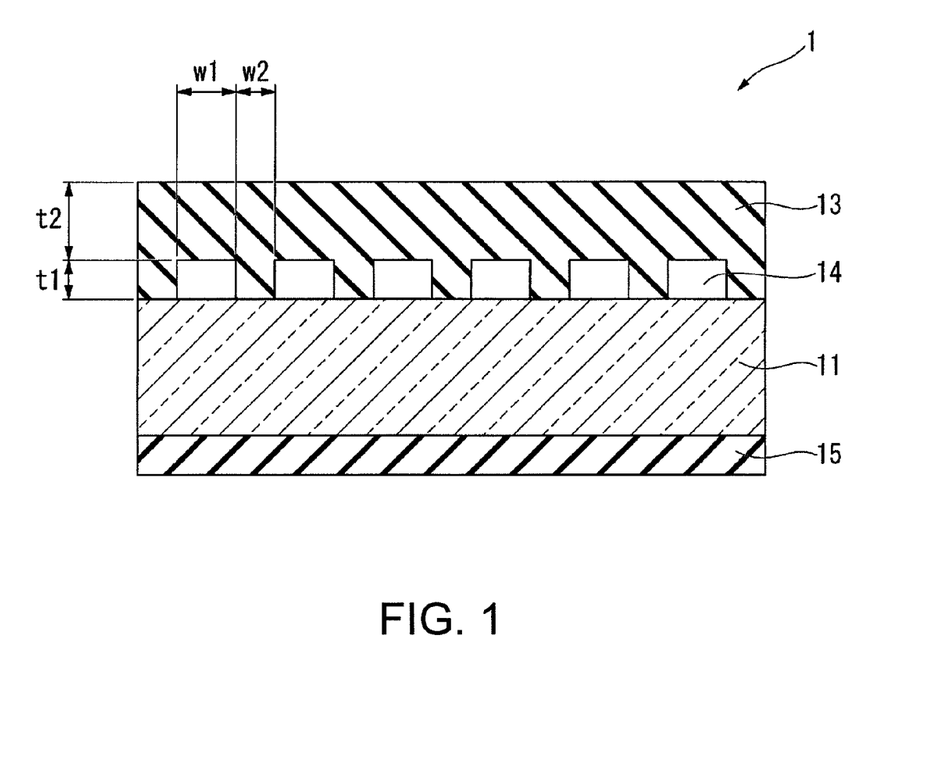
FIG. 1 is a schematic view representing a schematic structure of a semiconductor substrate according to First Embodiment of the invention.

FIG. 1 is a schematic view illustrating a schematic structure of a semiconductor substrate 1 according to First Embodiment of the invention.

As illustrated in FIG. 1, the semiconductor substrate 1 includes a silicon substrate 11, a monocrystalline silicon carbide film 13 formed on a surface of the silicon substrate 11, and a stress relieving film 15 formed on the surface of the silicon substrate 11 (the back surface of the silicon substrate 11) opposite from the side on which the monocrystalline silicon carbide film 13 is formed.

The silicon substrate 11 is formed, for example, by slicing and polishing a silicon single crystal ingot pulled out according to the CZ process (Czochralski process). The surface of the silicon substrate 11 represents a crystal plane with the Miller index (100). It is also possible to use an offset substrate that has a crystal plane crystal axis tilted several degrees.

The present embodiment uses a silicon monocrystalline substrate as the silicon substrate 11. However, the invention is not limited to this. For example, the silicon substrate 11 may be one obtained by forming a monocrystalline silicon film on a substrate formed of quartz, sapphire, or stainless steel. As used herein, the term "silicon substrate" is used to refer to both a silicon monocrystalline substrate, and a substrate obtained by forming a monocrystalline silicon film on a substrate formed of, for example, quartz, sapphire, or stainless steel.

Further, even though the surface of the silicon substrate 11 is described as representing a crystal plane with the Miller index (100), the surface is not limited to the (100) plane, and may be a (111) plane tilted 54.73 degrees with respect to the (100) plane. In this case, the silicon substrate 11 has a lattice constant of 0.543 nm.

The monocrystalline silicon carbide film 13 is formed on the surface of the silicon substrate 11. The monocrystalline silicon carbide film 13 is a semiconductor film formed by the epitaxial growth of cubical crystal silicon carbide (3C-SiC). Because of the large bandgap value of 2.2 eV or more, and the high thermal conductivity and high breakdown electric field, 3C-SiC is preferable as a wide bandgap semiconductor for power devices. The monocrystalline silicon carbide film 13 of 3C-SiC has a lattice constant of 0.436 nm. A plurality of spaces 14 is present in the monocrystalline silicon carbide film 13 in portions on the side of the silicon substrate 11 and along the interface between the monocrystalline silicon carbide film 13 and the silicon substrate 11.

Referring to FIG. 1, the height of the spaces 14 is represented by t1, the height from the upper end of the spaces 14 to the surface of the monocrystalline silicon carbide film 13 is represented by t2, the width of the spaces 14 is represented by w1, and the width of the monocrystalline silicon carbide film 13 in portions in contact with the silicon substrate 11 (the width of the monocrystalline silicon carbide film 13 between the adjacent two spaces 14) is represented by w2.

Desirably, the height t1 of the spaces 14 is greater than the product of the square root of two and the width w2 of the monocrystalline silicon carbide film 13 in portions in contact with the silicon substrate 11 ($t1 > \sqrt{2} \times w2$), and falls within a range of from 500 nm to 1,000 nm. For example, when the height t1 of the spaces 14 is 500 nm, the width w2 of the monocrystalline silicon carbide film 13 in portions in contact with the silicon substrate 11 is about 350 nm.

The width w1 of the spaces 14 is specified by the thickness of the monocrystalline silicon carbide film 13. The width w1 of the spaces 14 and the height t2 from the upper end of the spaces 14 to the surface of the monocrystalline silicon carbide film 13 are related to each other so that $w1 < 2 \times t2$.

The stress relieving film 15 is formed on the back surface of the silicon substrate 11. The stress relieving film 15 is formed of material that contains any one of, for example, silicon oxide, silicon nitride, polysilicon, and amorphous silicon. In the present embodiment, amorphous silicon is used as the material that forms the stress relieving film 15. The stress relieving film 15 relieves the stress in the silicon substrate 11 by applying compressional stress on the surface of the silicon substrate 11 opposite from the side on which the monocrystalline silicon carbide film 13 is formed.

Semiconductor Substrate Manufacturing Method

FIG. 2A to FIG. 3C are step diagrams representing the semiconductor substrate manufacturing method according to the present embodiment.

First, the silicon substrate 11 is prepared, and a monocrystalline silicon is contained in a vacuum chamber. The surface of the silicon substrate 11 is then heat treated under vacuum atmosphere (see FIG. 2A). The heat treatment cleans the surfaces of the silicon substrate 11, and removes the impurities adhered to the surfaces of the silicon substrate 11. In the following, the silicon substrate temperature may be referred to simply as "substrate temperature".

Figure 2A:
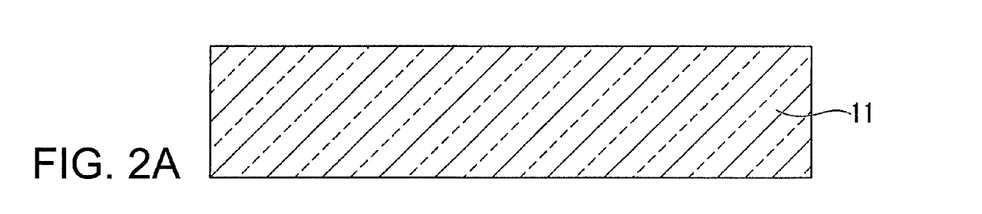
FIGS. 2A to 2D are step diagrams representing a semiconductor substrate manufacturing method according to First Embodiment.
Figure 2B:
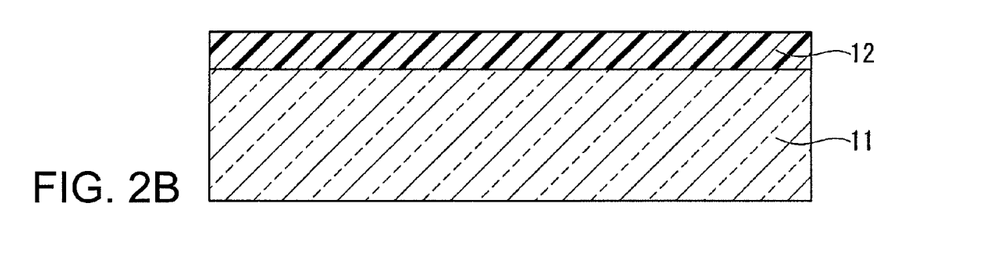

Then, a masking material 12 is formed on the surface of the silicon substrate 11 (see FIG. 2B, first step). For example, silicon oxide or silicon nitride is used as the material forming the masking material. Here, the surface of the silicon substrate 11 is subjected to a thermal oxidation treatment by using a thermal oxidation method to form the masking material 12 on the surface of the silicon substrate 11. The thickness of the masking material 12 is set within a range of, for example, from 500 nm to 1,000 nm.

Figure 2C:
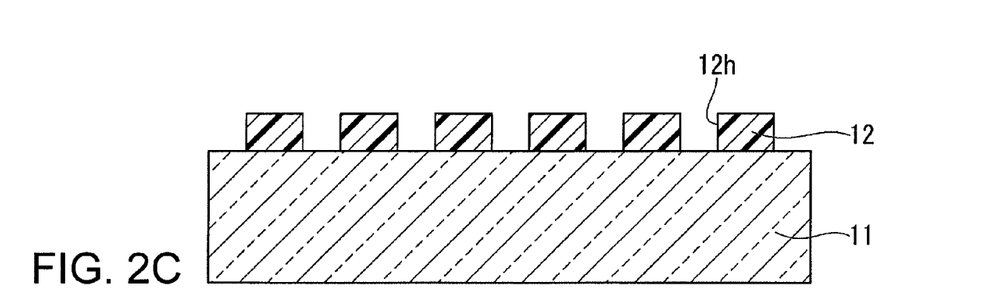

Thereafter, the masking material 12 is patterned to form openings 12h to partially expose the surface of the silicon substrate 11 (see FIG. 2C, second step). For example, a resist is applied on the masking material 12, and the resist is patterned into a desired pattern, for example, line-and-space, by using the photolithography technique. The masking material 12 is etched by using the patterned resist as a mask. As a result, the masking material 12 is patterned into a desired pattern shape, and the surface of the silicon substrate 11 is partially exposed through the openings 12h of the masking material 12.

For example, the masking material 12 has a height of about 500 nm, and a width of about 500 nm after being patterned, and the width of each opening 12h of the masking material 12 is about 500 nm.

Here, the width of each opening 12h of the masking material 12 ranges from 350 nm to 1,000 nm. A width of the openings 12h smaller than 350 nm requires higher accuracy than that for the i-line stepper in the photopatterning, and increases the manufacturing cost. There is also the risk of the spaces 14 not being able to sufficiently absorb the stress generated in the monocrystalline silicon carbide film 13 because of the differences in the lattice constants and the coefficients of thermal expansion of the silicon substrate 11 and the monocrystalline silicon carbide 13A. On the other hand, a width of the openings 12h larger than 1,000 nm increases the stress in the masking material 12, and has the risk of affecting the crystallinity of the monocrystalline silicon carbide film 13.

Note that the masking material 12 is anisotropically etched by dry etching such as reactive ion etching (RIE), because the side walls of the openings 12h require perpendicularity.

Thereafter, a feedstock gas of the monocrystalline silicon carbide film 13 is introduced into the chamber, and the substrate temperature is set to about 1,000° C. A substrate temperature above 1,000° C. is not preferable, because it causes the carbon feedstock gas introduced in the vicinity of the surface of the silicon substrate 11 to easily undergo pyrolysis or the like, and makes it difficult to form a stable carbon feedstock gas atmosphere.

For example, ethylene ($C_2H_4$) gas and dichlorosilane ($SiH_2Cl_2$) gas are used as the feedstock gas. The feedstock gas flow rate is, for example, about 2.5 sccm for the ethylene ($C_2H_4$) gas, and about 10 sccm for the dichlorosilane ($SiH_2Cl_2$) gas.

Figure 2D:
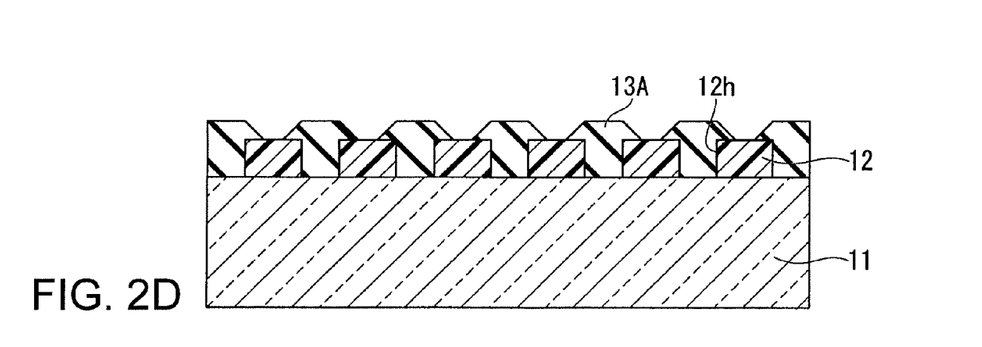

In this way, the epitaxial growth of monocrystalline silicon carbide 13A starts from the portions of the silicon substrate 11 exposed through the openings 12h, and stops while the surface of the masking material 12 is partially exposed (see FIG. 2D, third step).

For example, when the masking material 12 has a height of about 500 nm and a width of about 500 nm after being patterned, and when the width of each opening 12h of the masking material 12 is about 500 nm, forming the monocrystalline silicon carbide about 700 nm high can stop the epitaxial growth of the monocrystalline silicon carbide 13A while the surface of the masking material 12 is left open over a length of about 100 nm along the width direction of the masking material 12. In the present embodiment, the epitaxial growth of the monocrystalline silicon carbide 13A is performed for 2 hours under the foregoing conditions to form a monocrystalline silicon carbide having a height of about 700 nm.

Figure 3A:
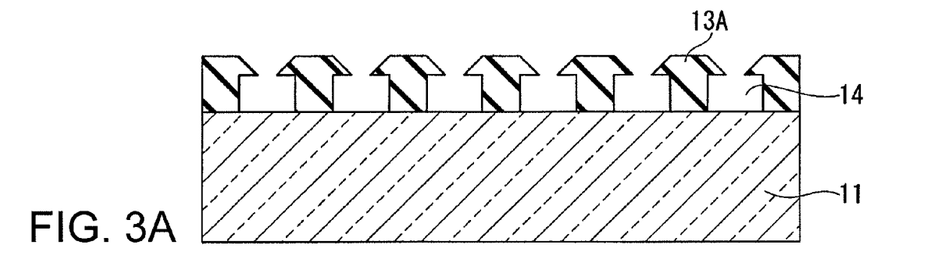
FIGS. 3A to 3C are step diagram representing the semiconductor substrate manufacturing method according to First Embodiment as a continuation from FIG. 2D.

Thereafter, the masking material 12 is removed by etching from the gaps in the monocrystalline silicon carbide 13A selectively grown (see FIG. 3A, fourth step). The masking material 12 is etched, for example, by wet etching using a dilute HF solution (DHF solution). The DHF isotropic etching can selectively remove only the masking material 12.

Figure 3B:
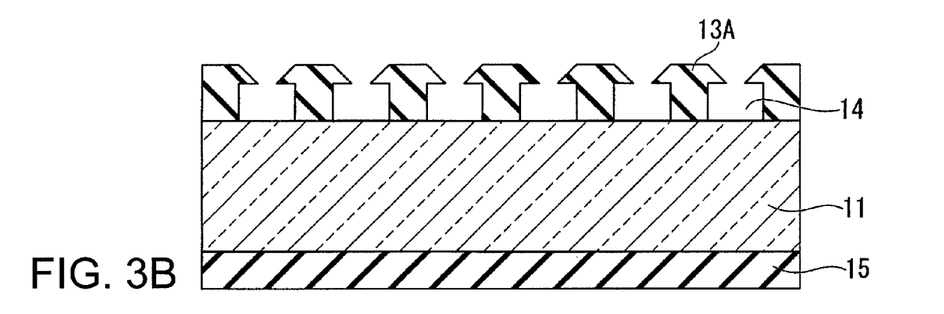

Then, the stress relieving film 15 is formed on the back surface of the silicon substrate 11 (see FIG. 3B, sixth step). For example, amorphous silicon is used as the material forming the stress relieving film 15. Preferably, a material having a larger coefficient of thermal expansion than the silicon substrate 11 is used as the material forming the stress relieving film 15. In this way, compressional stress can act on the back surface of the silicon substrate 11 (the silicon substrate 11 surface with the stress relieving film 15).

The stress relieving film 15 can be formed by methods, for example, such as a plasma CVD method and sputtering. When using these methods, it is preferable to flip the silicon substrate 11, and form the stress relieving film 15 on the flipped back surface of the silicon substrate 11.

The stress relieving film 15 may also be formed by using a thermal CVD method. When using this method, the stress relieving film is simultaneously formed on the both surfaces of the silicon substrate 11 before removing the masking material 12, and the masking material 12 is removed after removing only the stress relieving film on the front surface side of the silicon substrate 11. In this way, the stress relieving film 15 can be formed only on the back surface of the silicon substrate 11. The stress relieving film (stress relieving film formed of amorphous silicon) on the front surface side of the silicon substrate 11 can be removed by wet etching using a mixture of DHF and ozone water. The masking material 12 is etched with DHF after the etching of the stress relieving film.

Figure 3C:
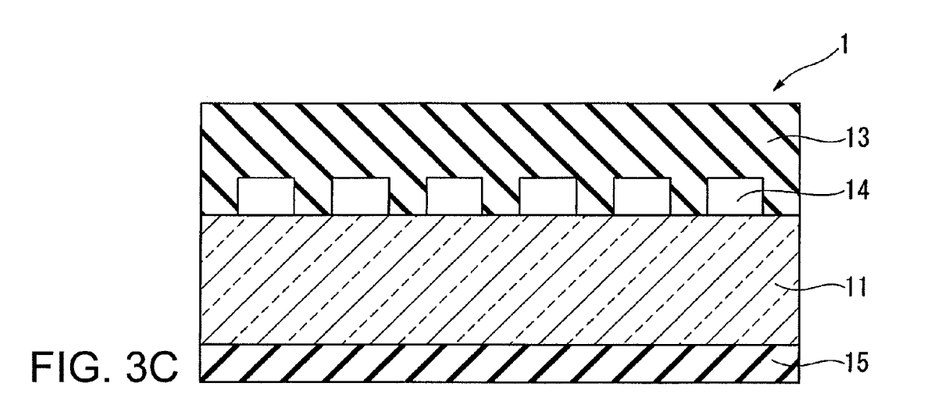

Thereafter, the halted epitaxial growth of the monocrystalline silicon carbide 13A is resumed to form the monocrystalline silicon carbide film 13 over the spaces 14 (see FIG. 3C, fifth step). The epitaxial growth of the monocrystalline silicon carbide 13A is resumed under the same conditions as for the selective growth (third step). The spaces 14 are sealed while remaining between the silicon substrate 11 and the monocrystalline silicon carbide film 13. The spaces 14 absorb the stress generated in the monocrystalline silicon carbide film 13 because of the differences in the lattice constants and the coefficients of thermal expansion of the silicon substrate 11 and the monocrystalline silicon carbide 13A.

Note that the spaces 14 may be buried by forming the monocrystalline silicon carbide about 750 nm high when resuming the epitaxial growth of the monocrystalline silicon carbide 13A. Further, the surface of the monocrystalline silicon carbide film 13 may be planarized by forming the monocrystalline silicon carbide 750 nm or higher.

The semiconductor substrate 1 of the present embodiment can be manufactured by following these steps.

FIGS. 4A to 4D are diagrams representing how the wafer bending is suppressed in the manufacturing process of the semiconductor substrate according to the present embodiment. As used herein, "wafer" refers to a silicon substrate, a semiconductor substrate, and a whole silicon substrate that includes various films formed in the process of manufacturing a semiconductor substrate from a silicon substrate.

Bending occurs in the wafer from the stress generated in the silicon substrate 11 because of the differences in the lattice constants and the coefficients of thermal expansion of the silicon substrate and the monocrystalline silicon carbide.

Figure 4A:
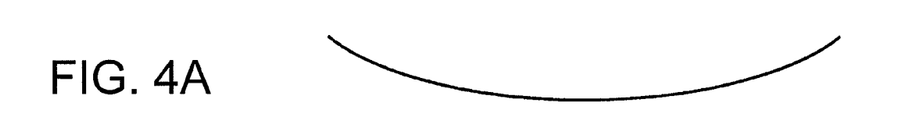
FIGS. 4A to 4D are diagrams representing how wafer bending is suppressed in the manufacturing process of the semiconductor substrate according to First Embodiment.

FIG. 4A shows how bending occurs in a wafer after the monocrystalline silicon carbide is epitaxially grown on the silicon substrate surface (when the substrate temperature is increased to an epitaxial growth temperature).

The lattice constants of the silicon substrate and the monocrystalline silicon carbide are 0.543 nm and 0.436 nm, respectively, and the difference is about 20%. Because of this lattice constant difference, compressional stress acts on the silicon substrate surface, and the wafer bends upward.

Figure 4B:
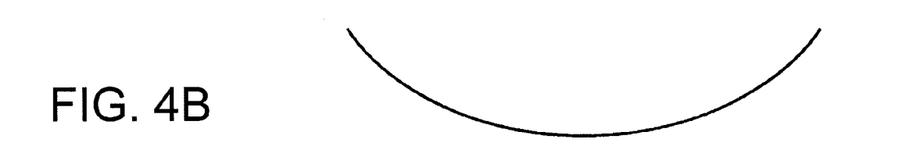

FIG. 4B shows how bending occurs in a wafer after the monocrystalline silicon carbide is epitaxially grown on the silicon substrate surface (when the substrate temperature is at room temperature).

The internal stress due to the lattice constant difference also remains in this case, and compressional stress acts on the silicon substrate surface to bend the wafer upward. However, the coefficients of thermal expansion of the silicon substrate and the monocrystalline silicon carbide are $2.55\times10^{-6}$ $K^{-1}$ and $2.77\times10^{-6}$ $K^{-1}$, respectively, and the difference is about 8%. Because the monocrystalline silicon carbide has a larger coefficient of thermal expansion than the silicon substrate, the difference in the coefficients of thermal expansion makes the extent of wafer bending greater than in FIG. 4A after the substrate temperature is lowered from the epitaxial growth temperature to room temperature.

Figure 4C:
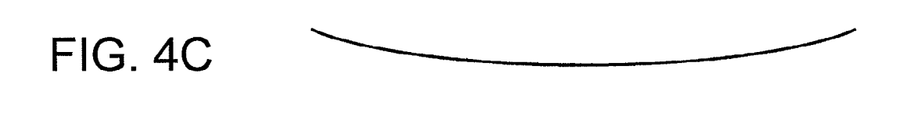

FIG. 4C shows how wafer bending occurs after the monocrystalline silicon carbide is selectively and epitaxially grown on the silicon substrate surface (after the third step).

In the present embodiment, the plurality of spaces absorbs the stresses generated in the monocrystalline silicon carbide film and the silicon substrate because of the differences in the lattice constants and the coefficients of thermal expansion of the silicon substrate and the monocrystalline silicon carbide. As a result, the extent of wafer bending is smaller than in FIG. 4B.

Figure 4D:
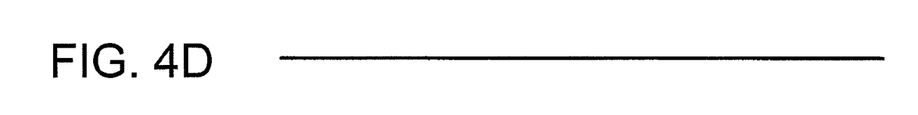

FIG. 4D shows how bending occurs in a wafer when the substrate temperature is maintained at room temperature after the epitaxial growth of the monocrystalline silicon carbide is resumed to form the monocrystalline silicon carbide film (the final product).

In the present embodiment, the stress relieving film relieves the stress that cannot be absorbed by the spaces and remains in the silicon substrate. Specifically, even in the presence of compressional stress acting on the surface of the silicon substrate because of the differences in the lattice constants and the coefficients of thermal expansion of the silicon substrate and the monocrystalline silicon carbide, the compressional stress acting on the silicon substrate can be cancelled by the compressional stress applied on the opposite surface (the back surface of the silicon substrate). As a result, wafer bending can be suppressed.

With the semiconductor substrate 1 and the semiconductor substrate manufacturing method of the present embodiment, the surface defects generated at the interface between the silicon substrate 11 and the monocrystalline silicon carbide film 13 propagate to the upper layer as the monocrystalline silicon carbide 13A grows, and disappear upon reaching the side walls of the openings 12h of the masking material 12. Further, the spaces 14 can absorb the stress generated in the monocrystalline silicon carbide film 13 because of the differences in the lattice constants and the coefficients of thermal expansion of the silicon substrate 11 and the monocrystalline silicon carbide 13A. The spaces 14 also can absorb the stress generated in the silicon substrate 11 because of the differences in the lattice constants and the coefficients of thermal expansion of the silicon substrate 11 and the monocrystalline silicon carbide 13A. Further, the stress relieving film 15 can relieve the stress that cannot be absorbed by the spaces 14 and remains in the silicon substrate 11. Specifically, even in the presence of compressional stress acting on the silicon substrate 11 on the surface on which the monocrystalline silicon carbide film 13 is formed because of the differences in the lattice constants and the coefficients of thermal expansion of the silicon substrate 11 and the monocrystalline silicon carbide 13A, the compressional stress acting on the silicon substrate 11 can be cancelled by the compressional stress applied on the opposite surface (the silicon substrate 11 surface with the stress relieving film 15). As a result, the monocrystalline silicon carbide film 13 can have high quality and a few crystal defects, and wafer bending can be suppressed.

Further, because the material forming the stress relieving film 15 contains amorphous silicon, the stress relieving film 15 can be realized that can apply compressional stress on the surface of the silicon substrate 11 opposite from the side on which the monocrystalline silicon carbide film 13 is formed.

Further, because the material forming the masking material 12 contains silicon oxide, the masking material 12 can be formed on the surface of the silicon substrate 11 by a simple method.

Second Embodiment

Figure 5:
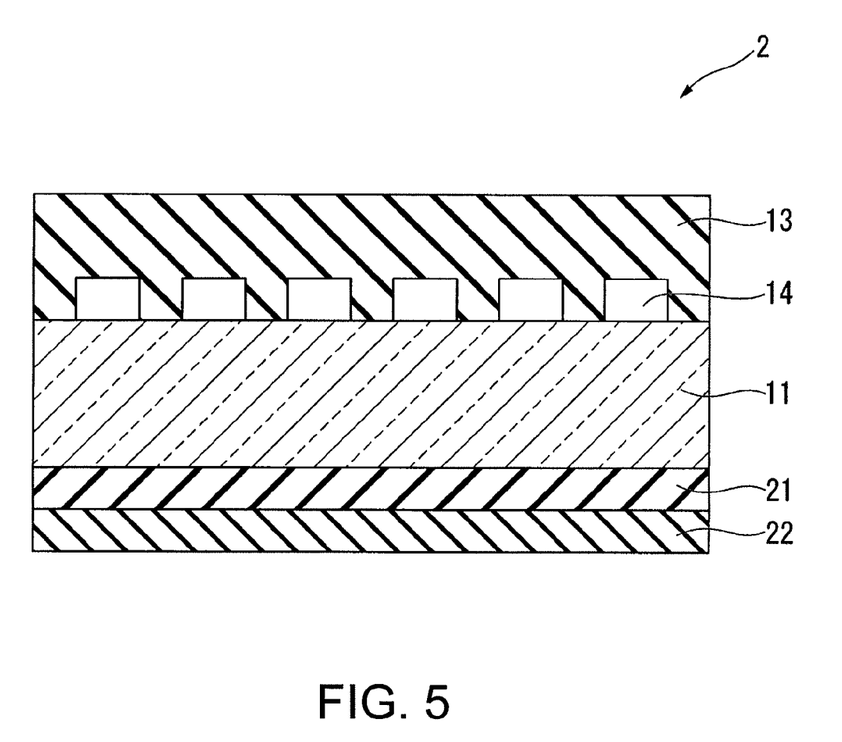
FIG. 5 is a schematic view representing a schematic structure of a semiconductor substrate according to Second Embodiment of the invention.

FIG. 5 is a schematic view representing a schematic structure of a semiconductor substrate 2 according to Second Embodiment of the invention.

As illustrated in FIG. 5, the semiconductor substrate 2 according to the present embodiment differs from the semiconductor substrate 1 of First Embodiment in that the stress relieving film has a laminate structure of a first stress relieving film 21 and a second stress relieving film 22. The other configuration is the same as in First Embodiment, and will be referred to by using the same reference numerals. Detailed descriptions thereof are omitted accordingly.

As illustrated in FIG. 5, the semiconductor substrate 2 includes a silicon substrate 11, a monocrystalline silicon carbide film 13 formed on a surface of the silicon substrate 11, the first stress relieving film 21 formed on the surface of the silicon substrate 11 opposite from the side on which the monocrystalline silicon carbide film 13 is formed (on the back surface of the silicon substrate 11), and the second stress relieving film 22 formed on the surface of the first stress relieving film 21 (on the surface of the first stress relieving film 21 opposite from the side on which the silicon substrate 11 is formed).

In the present embodiment, silicon oxide is used as the material forming the first stress relieving film 21. Amorphous silicon is used as the material forming the second stress relieving film 22. The first stress relieving film 21 and the second stress relieving film 22 relieve the stress in the silicon substrate 11 by applying compressional stress on the surface of the silicon substrate 11 opposite from the side on which the monocrystalline silicon carbide film 13 is formed.

Semiconductor Substrate Manufacturing Method

FIGS. 6A to 6D are step diagrams representing the semiconductor substrate manufacturing method according to the present embodiment. In the semiconductor substrate manufacturing method according to the present embodiment, the heat treatment step of cleaning the surfaces of the silicon substrate 11 is the same as the heat treatment step in the semiconductor substrate manufacturing method of First Embodiment (see FIG. 2A), and detailed descriptions thereof are omitted.

Figure 6A:
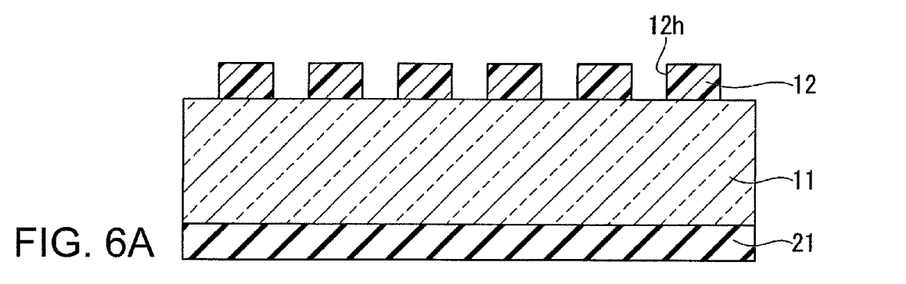
FIGS. 6A to 6D are step diagrams representing a semiconductor substrate manufacturing method according to Second Embodiment.

In the present embodiment, the masking material 12 is formed on the front surface of the silicon substrate 11, and the first stress relieving film 21 is formed on the back surface of the silicon substrate 11 (see FIG. 6A, first step). Here, the front and back surfaces of the silicon substrate 11 are subjected to a thermal oxidation treatment by using a thermal oxidation method to form the masking material 12 and the first stress relieving film 21 on the front and the back surfaces of the silicon substrate 11, respectively. The thicknesses of the masking material 12 and the first stress relieving film 21 are each set to, for example, 500 nm.

The thickness of the first stress relieving film 21 may be adjusted to apply an appropriate compressional stress to the back surface of the silicon substrate 11. For example, a BHF solution as a mixture of $NH_4F$ in HF may be used as an etchant. Here, the surface of the silicon substrate 11 is protected by a resist film to prevent etching the masking material 12 on the surface of the silicon substrate 11. The resist film is removed after the etching of the first stress relieving film 21 on the back surface of the silicon substrate 11.

Thereafter, the masking material 12 is patterned to form the openings 12h, and partially expose the surface of the silicon substrate 11 (second step). For example, the masking material 12 has a height of about 500 nm, and a width of about 500 nm after being patterned, and the width of each opening 12h of the masking material 12 is about 500 nm.

Note that the masking material 12 is anisotropically etched by dry etching such as reactive ion etching (RIE), because the side walls of the openings 12h require perpendicularity.

Thereafter, a feedstock gas of the monocrystalline silicon carbide film 13 is introduced into the chamber, and the substrate temperature is set to about 1,000° C. For example, ethylene ($C_2H_4$) gas and dichlorosilane ($SiH_2Cl_2$) gas are used as the feedstock gas. The feedstock gas flow rate is, for example, about 2.5 sccm for the ethylene ($C_2H_4$) gas, and about 10 sccm for the dichlorosilane ($SiH_2Cl_2$) gas.

Figure 6B:
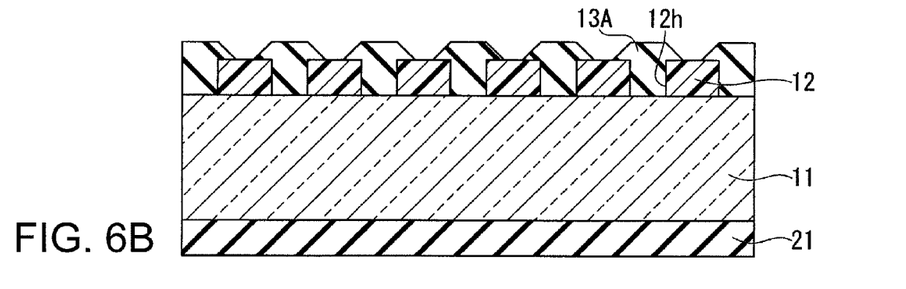

In this way, the epitaxial growth of the monocrystalline silicon carbide 13A starts from the portions of the silicon substrate 11 exposed through the openings 12h, and stops while the surface of the masking material 12 is partially exposed (see FIG. 6B, third step).

For example, when the masking material 12 has a height of about 500 nm and a width of about 500 nm after being patterned, and when the width of each opening 12h of the masking material 12 is about 500 nm, forming the monocrystalline silicon carbide about 700 nm high can stop the epitaxial growth of the monocrystalline silicon carbide 13A while the surface of the masking material 12 is left open over a length of about 100 nm along the width direction of the masking material 12. In the present embodiment, the epitaxial growth of the monocrystalline silicon carbide 13A is performed for 2 hours under the foregoing conditions to form a monocrystalline silicon carbide having a height of about 700 nm.

Figure 6C:
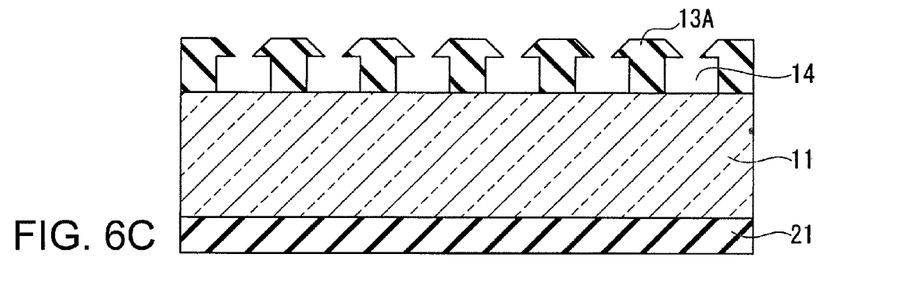

Thereafter, the masking material 12 is removed by etching from the gaps in the monocrystalline silicon carbide 13A selectively grown (see FIG. 6C, fourth step). Here, the first stress relieving film 21 on the back surface of the silicon substrate 11 is protected by a resist film to prevent etching. The etching of the masking material 12 is performed, for example, by wet etching with a BHF solution prepared as a mixture of $NH_4F$ in HF. The BHF isotropic etching can selectively remove only the masking material 12. The resist film protecting the first stress relieving film 21 is removed after the etching of the masking material 12.

Figure 6D:
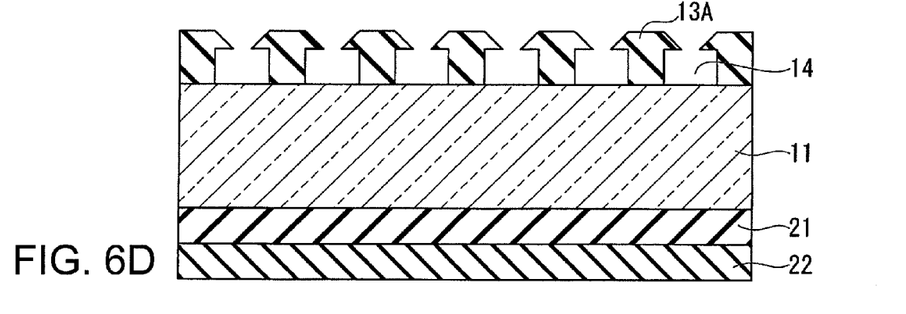

Thereafter, the second stress relieving film 22 is formed on the surface of the first stress relieving film 21 (see FIG. 6D, sixth step). For example, amorphous silicon is used as the material forming the second stress relieving film 22. Preferably, a material having a larger coefficient of thermal expansion than the silicon substrate 11 is used as the material forming the second stress relieving film 22. In this way, compressional stress can act on the back surface of the silicon substrate 11 (the silicon substrate 11 surface with the first stress relieving film 21).

The second stress relieving film 22 can be formed by methods, for example, such as a plasma CVD method and sputtering. When using these methods, it is preferable to flip the silicon substrate 11, and form the second stress relieving film 22 on the flipped back surface of the silicon substrate 11.

The second stress relieving film 22 may also be formed by using a thermal CVD method. When using this method, the stress relieving film is simultaneously formed on the both surfaces of the silicon substrate 11 before removing the masking material 12, and the masking material 12 is removed after removing only the stress relieving film on the front surface side of the silicon substrate 11. In this way, the second stress relieving film 22 can be formed only on the back surface of the silicon substrate 11. The stress relieving film (stress relieving film formed of amorphous silicon) on the front surface side of the silicon substrate 11 can be removed by wet etching using a mixture of DHF and ozone water. The masking material 12 is etched with DHF after the etching of the stress relieving film.

Thereafter, the halted epitaxial growth of the monocrystalline silicon carbide 13A is resumed to form the monocrystalline silicon carbide film 13 over the spaces 14 (fifth step). The epitaxial growth of the monocrystalline silicon carbide 13A is resumed under the same conditions as for the selective growth (third step). The spaces 14 are sealed while remaining between the silicon substrate 11 and the monocrystalline silicon carbide film 13. The spaces 14 absorb the stress generated in the monocrystalline silicon carbide film 13 because of the differences in the lattice constants and the coefficients of thermal expansion of the silicon substrate 11 and the monocrystalline silicon carbide 13A.

Note that the spaces 14 may be buried by forming the monocrystalline silicon carbide about 750 nm high when resuming the epitaxial growth of the monocrystalline silicon carbide 13A. Further, the surface of the monocrystalline silicon carbide film 13 may be planarized by forming the monocrystalline silicon carbide 750 nm or higher.

The semiconductor substrate 2 of the present embodiment can be manufactured by following these steps.

With the semiconductor substrate 2 and the semiconductor substrate manufacturing method of the present embodiment, different films, specifically the first stress relieving film 21 and the second stress relieving film 22 can be formed. For example, film forming conditions such as film thickness and film material can be appropriately varied for the first stress relieving film 21 and the second stress relieving film 22. This makes it possible to adjust the extent to which the stress that cannot be absorbed by the spaces 14 and remains in the silicon substrate 11 is relieved. Wafer bending can thus be more easily suppressed.

Further, the stress generated in the silicon substrate 11 because of the differences in the lattice constants and the coefficients of thermal expansion of the silicon substrate 11 and the monocrystalline silicon carbide 13A can be absorbed by the first stress relieving film 21 in the early stage of the epitaxial growth of the monocrystalline silicon carbide 13A in the process of stopping the epitaxial growth of the monocrystalline silicon carbide 13A while the surface of the masking material 12 is partially exposed. Further, the stress generated in the silicon substrate 11 because of the differences in the lattice constants and the coefficients of thermal expansion of the silicon substrate 11 and the monocrystalline silicon carbide 13A can be absorbed by the first stress relieving film 21 and the second stress relieving film 22 in the process of resuming the epitaxial growth of the monocrystalline silicon carbide 13A and forming the monocrystalline silicon carbide film 13 after the removal of the masking material 12. Specifically, the stress generated in the silicon substrate 11 at different timings can be absorbed by the different stress relieving films 21 and 22. Wafer bending can thus be more easily suppressed.

Third Embodiment

Figure 7:
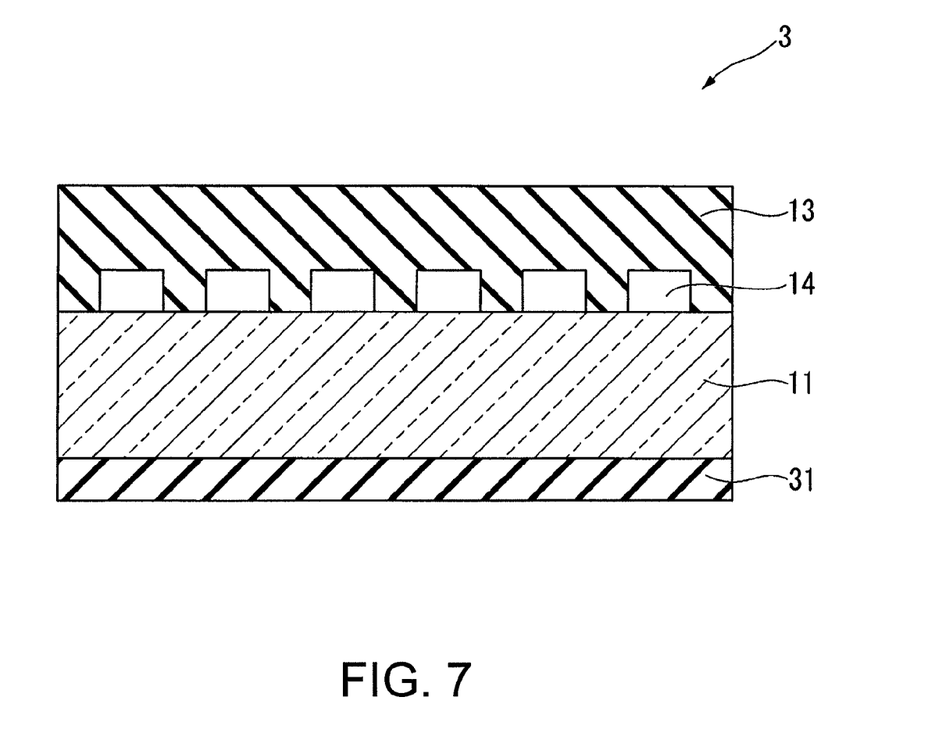
FIG. 7 is a schematic view representing a schematic structure of a semiconductor substrate according to Third Embodiment of the invention.

FIG. 7 is a schematic view representing a schematic structure of a semiconductor substrate 3 according to Third Embodiment of the invention.

As illustrated in FIG. 7, the semiconductor substrate 3 according to the present embodiment differs from the semiconductor substrate 1 of First Embodiment in that silicon oxide is used as the material forming the stress relieving film. The other configuration is the same as in First Embodiment, and will be referred to by using the same reference numerals. Detailed descriptions thereof are omitted accordingly.

As illustrated in FIG. 7, the semiconductor substrate 3 includes a silicon substrate 11, a monocrystalline silicon carbide film 13 formed on a surface of the silicon substrate 11, and a stress relieving film 31 formed on the surface of the silicon substrate 11 opposite from the side on which the monocrystalline silicon carbide film is formed (on the back surface of the silicon substrate 11).

In the present embodiment, silicon oxide is used as the material forming the stress relieving film 31. The stress relieving film 31 relieves the stress in the silicon substrate 11 by applying compressive stress on the surface of the silicon substrate 11 opposite from the side on which the monocrystalline silicon carbide film 13 is formed.

Semiconductor Substrate Manufacturing Method

Figure 8A:
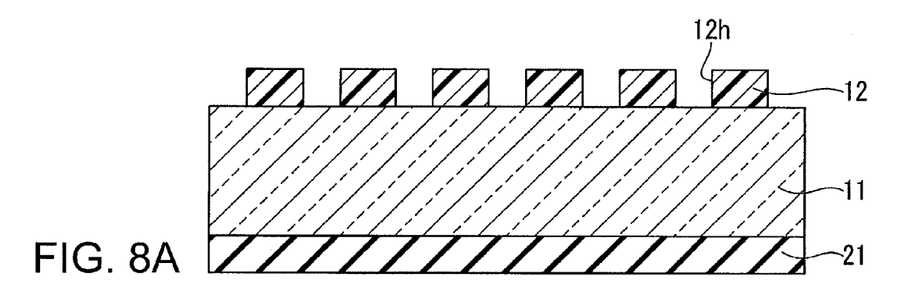
FIGS. 8A to 8C are step diagrams representing a semiconductor substrate manufacturing method according to Third Embodiment.
Figure 8B:
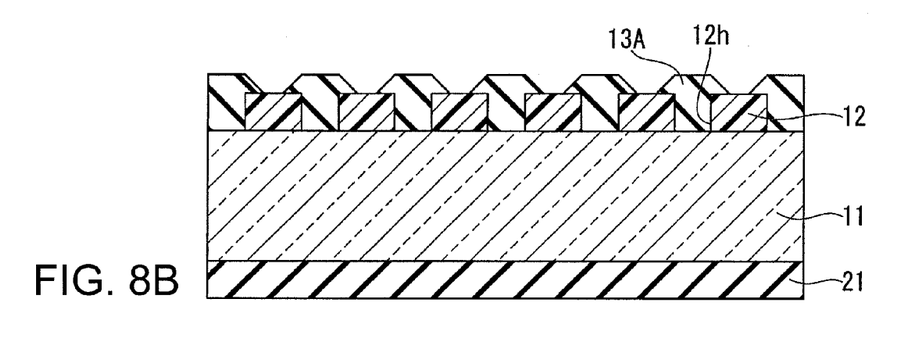
Figure 8C:
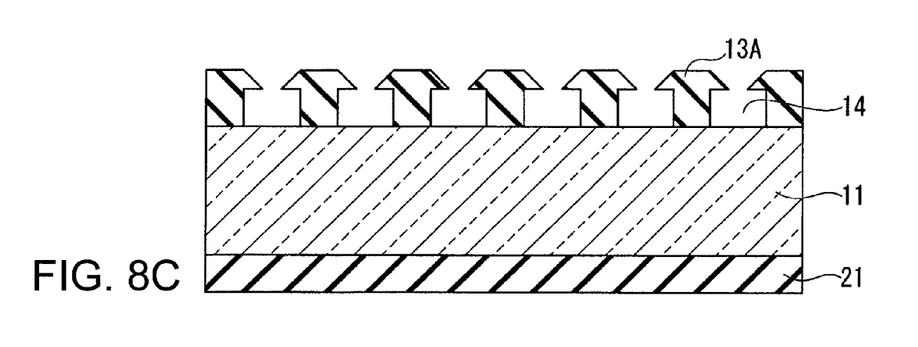

FIGS. 8A to 8C are step diagrams representing the semiconductor substrate manufacturing method according to the present embodiment. In the semiconductor substrate manufacturing method according to the present embodiment, the heat treatment step of cleaning the surfaces of the silicon substrate 11 is the same as the heat treatment step in the semiconductor substrate manufacturing method of First Embodiment (see FIG. 2A), and detailed descriptions thereof are omitted.

In the present embodiment, the masking material 12 is formed on the front surface of the silicon substrate 11, and the stress relieving film 31 is formed on the back surface of the silicon substrate 11 (see FIG. 8A, first step). Here, the front and back surfaces of the silicon substrate 11 are subjected to a thermal oxidation treatment by using a thermal oxidation method to form the masking material 12 and the stress relieving film 31 on the front and the back surfaces of the silicon substrate 11, respectively. The thicknesses of the masking material 12 and the stress relieving film 31 are each set to, for example, 500 nm.

The thickness of the stress relieving film 31 may be adjusted to apply an appropriate compressional stress to the back surface of the silicon substrate 11. For example, a BHF solution as a mixture of $NH_4F$ in HF may be used as an etchant. Here, the surface of the silicon substrate 11 is protected by a resist film to prevent etching the masking material 12 on the surface of the silicon substrate 11. The resist film is removed after the etching of the stress relieving film 31 on the back surface of the silicon substrate 11.

Thereafter, the masking material 12 is patterned to form the openings 12h, and partially expose the surface of the silicon substrate 11 (second step). For example, the masking material 12 has a height of about 500 nm, and a width of about 500 nm after being patterned, and the width of each opening 12h of the masking material 12 is about 500 nm.

Note that the masking material 12 is anisotropically etched by dry etching such as reactive ion etching (RIE), because the side walls of the openings 12h require perpendicularity.

Thereafter, a feedstock gas of the monocrystalline silicon carbide film 13 is introduced into the chamber, and the substrate temperature is set to about 1,000° C. For example, ethylene ($C_2H_4$) gas and dichlorosilane ($SiH_2Cl_2$) gas are used as the feedstock gas. The feedstock gas flow rate is, for example, about 2.5 sccm for the ethylene ($C_2H_4$) gas, and about 10 sccm for the dichlorosilane ($SiH_2Cl_2$) gas.

In this way, the epitaxial growth of monocrystalline silicon carbide 13A starts from the portions of the silicon substrate 11 exposed through the openings 12h, and stops while the surface of the masking material 12 is partially exposed (see FIG. 8B, third step).

For example, when the masking material 12 has a height of about 500 nm and a width of about 500 nm after being patterned, and when the width of each opening 12h of the masking material 12 is about 500 nm, forming the monocrystalline silicon carbide about 700 nm high can stop the epitaxial growth of the monocrystalline silicon carbide 13A while the surface of the masking material 12 is left open over a length of about 100 nm along the width direction of the masking material 12. In the present embodiment, the epitaxial growth of the monocrystalline silicon carbide 13A is performed for 2 hours under the foregoing conditions to form a monocrystalline silicon carbide having a height of about 700 nm.

Thereafter, the masking material 12 is removed by etching from the gaps in the monocrystalline silicon carbide 13A selectively grown (see FIG. 8C, fourth step). Here, the stress relieving film 31 on the back surface of the silicon substrate 11 is protected by a resist film to prevent etching. The etching of the masking material 12 is performed, for example, by wet etching with a BHF solution prepared as a mixture of $NH_4F$ in HF. The BHF isotropic etching can selectively remove only the masking material 12. The resist film protecting the stress relieving film 31 is removed after the etching of the masking material 12.

Here, the thickness of the stress relieving film 31 may be adjusted to apply an appropriate compressional stress to the back surface of the silicon substrate 11. For example, a dilute HF solution (DHF solution) may be used as an etchant.

Thereafter, the halted epitaxial growth of the monocrystalline silicon carbide 13A is resumed to form the monocrystalline silicon carbide film 13 over the spaces 14 (fifth step). The epitaxial growth of the monocrystalline silicon carbide 13A is resumed under the same conditions as for the selective growth (third step). The spaces 14 are sealed while remaining between the silicon substrate 11 and the monocrystalline silicon carbide film 13. The spaces 14 absorb the stress generated in the monocrystalline silicon carbide film 13 because of the differences in the lattice constants and the coefficients of thermal expansion of the silicon substrate 11 and the monocrystalline silicon carbide 13A.

Note that the spaces 14 may be buried by forming the monocrystalline silicon carbide about 750 nm high when resuming the epitaxial growth of the monocrystalline silicon carbide 13A. Further, the surface of the monocrystalline silicon carbide film 13 may be planarized by forming the monocrystalline silicon carbide 750 nm or higher.

The semiconductor substrate 3 of the present embodiment can be manufactured by the steps described above.

With the semiconductor substrate 3 and the semiconductor substrate manufacturing method of the present embodiment, the stress generated in the silicon substrate 11 because of the differences in the lattice constants and the coefficients of thermal expansion of the silicon substrate 11 and the monocrystalline silicon carbide 13A can be absorbed by the stress relieving film in the early stage of the epitaxial growth of the monocrystalline silicon carbide 13A in the process of stopping the epitaxial growth of the monocrystalline silicon carbide 13A while the surface of the masking material 12 is partially exposed. Further, the stress generated in the silicon substrate 11 because of the differences in the lattice constants and the coefficients of thermal expansion of the silicon substrate 11 and the monocrystalline silicon carbide 13A can be absorbed by the stress relieving film 31 of an adjusted thickness in the process of resuming the epitaxial growth of the monocrystalline silicon carbide 13A and forming the monocrystalline silicon carbide film 13 after the removal of the masking material 12. Specifically, the stress generated in the silicon substrate 11 at different timings can be absorbed by the stress relieving film 31 of varying thicknesses. Wafer bending can thus be more easily suppressed.

Further, the stress relieving film 31 can be formed in the step of forming the masking material 12. The manufacturing steps can thus be simplified compared to forming the stress relieving film 31 in a different step from the step of forming the masking material 12.

The entire disclosure of Japanese Patent Application No. 2012-008102, filed Jan. 18, 2012 is expressly incorporated reference herein.

What is claimed is:

1. A semiconductor substrate comprising:
   a silicon substrate;
   a monocrystalline silicon carbide film disposed on a surface of the silicon substrate; and
   a stress relieving film disposed on a first surface of the silicon substrate opposite from the side on which the monocrystalline silicon carbide film is disposed, the stress relieving film compressing the first surface of the silicon substrate towards a center of the first surface and that relieves stress in the silicon substrate by applying compressional stress to the silicon substrate surface on which the stress relieving film is disposed, the stress relieving film in contact with and extending along an entire surface of the silicon substrate,
   wherein a plurality of spaces are present in the monocrystalline silicon carbide film in portions on the side of the silicon substrate and along an interface between the monocrystalline silicon carbide film and the silicon substrate, a width of the spaces being less than twice a thickness of the monocrystalline silicon carbide formed over the spaces.

2. The semiconductor substrate according to claim 1, wherein the stress relieving film is a laminate of a first stress relieving film and a second stress relieving film.

3. The semiconductor substrate according to claim 1, wherein the stress relieving film contains any one of silicon oxide, silicon nitride, polysilicon, and amorphous silicon.

4. A semiconductor substrate manufacturing method comprising:
   a first step of forming a masking material on a surface of a silicon substrate;
   a second step of forming a plurality of openings in the masking material to partially expose the silicon substrate;
   a third step of growing monocrystalline silicon carbide from the exposed surface of the silicon substrate, and stopping the growth of the monocrystalline silicon carbide while the surface of the masking material is partially exposed;
   a fourth step of at least partially removing the masking material;
   a fifth step of growing the monocrystalline silicon carbide after the fourth step to form a monocrystalline silicon carbide film; and
   a forming step of forming before the fifth step a stress relieving film on the surface of the silicon substrate opposite from the side on which the monocrystalline silicon carbide film is formed, the stress relieving film being formed to apply compressional stress to the silicon substrate surface on which the stress relieving film is formed and to relieve stress in the silicon substrate, the forming step including forming a first stress relieving film on the surface of the silicon substrate opposite from the side on which the monocrystalline silicon carbide film is formed and forming a second stress relieving film on a surface of the first stress relieving film,
   wherein the first stress relieving film is formed before the third step on the surface of the silicon substrate opposite from the side on which the monocrystalline silicon carbide film is formed, and
   wherein the second stress relieving film is formed after the third step and before the fifth step on the surface of the first stress relieving film.

5. The method according to claim 4, wherein the stress relieving film is formed in the first step on the surface of the silicon substrate opposite from the side on which the monocrystalline silicon carbide film is formed.

6. The method according to claim 4, wherein the material forming the masking material contains silicon oxide or silicon nitride.

7. The method according to claim 4, wherein the material forming the stress relieving film contains any one of silicon oxide, silicon nitride, polysilicon, and amorphous silicon.

8. The method according to claim 4,
   wherein the third step includes epitaxially growing the monocrystalline silicon carbide, and
   wherein the fifth step includes epitaxially growing the monocrystalline silicon carbide.

9. A semiconductor substrate manufacturing method comprising:
   a first step of forming a masking material on a surface of a silicon substrate;
   a second step of forming a plurality of openings in the masking material to partially expose the silicon substrate;
   a third step of growing monocrystalline silicon carbide from the exposed surface of the silicon substrate, and stopping the growth of the monocrystalline silicon carbide while the surface of the masking material is partially exposed;
   a fourth step of at least partially removing the masking material;
   a fifth step of growing the monocrystalline silicon carbide after the fourth step to form a monocrystalline silicon carbide film; and
   a forming step of forming before the fifth step a stress relieving film on the surface of the silicon substrate opposite from the side on which the monocrystalline silicon carbide film is formed, the stress relieving film being formed to apply compressional stress to the silicon substrate surface on which the stress relieving film is formed and to relieve stress in the silicon substrate,
   wherein the stress relieving film is formed before the third step on the surface of the silicon substrate opposite from the side on which the monocrystalline silicon carbide film is formed, and
   wherein the thickness of the stress relieving film is adjusted after the third step and before the fifth step.

10. The method according to claim 9, wherein the stress relieving film is formed in the first step on the surface of the silicon substrate opposite from the side on which the monocrystalline silicon carbide film is formed.

11. The method according to claim 9, wherein the material forming the masking material contains silicon oxide or silicon nitride.

12. The method according to claim 9, wherein the material forming the stress relieving film contains any one of silicon oxide, silicon nitride, polysilicon, and amorphous silicon.

13. The method according to claim 9,
wherein the third step includes epitaxially growing the monocrystalline silicon carbide, and
wherein the fifth step includes epitaxially growing the monocrystalline silicon carbide.

* * * * *